United States Patent [19]

Wright

[11] Patent Number: 4,554,574

[45] Date of Patent: Nov. 19, 1985

[54] RECTIFIER ASSEMBLY FOR PARALLEL CONNECTION OF DIODES

[75] Inventor: Bruce R. Wright, St. Louis, Mo.

[73] Assignee: Associated Equipment Corporation, St. Louis, Mo.

[21] Appl. No.: 735,708

[22] Filed: May 17, 1985

Related U.S. Application Data

[63] Continuation of Ser. No. 519,896, Aug. 4, 1983, abandoned, which is a continuation of Ser. No. 222,326, Jan. 5, 1981, abandoned.

[51] Int. Cl.⁴ ..................... H01L 25/04; H01L 23/34; H01L 21/603; H01L 21/326

[52] U.S. Cl. ..................... 357/74; 357/75; 357/76; 357/79; 357/68; 357/81

[58] Field of Search ..................... 357/75, 76, 81, 74, 357/79, 68

[56] References Cited

U.S. PATENT DOCUMENTS

| | | | |
|---|---|---|---|
| 2,972,096 | 11/1957 | Johnson | 357/81 |
| 3,226,603 | 12/1965 | Finn, Jr. et al. | 357/75 |
| 3,231,794 | 1/1966 | Diebold | 357/81 |
| 3,335,328 | 8/1967 | Brackett | 357/75 |
| 3,489,960 | 1/1970 | Hudman | 357/76 |
| 3,611,107 | 10/1971 | Ruckel | 317/234 |
| 3,665,287 | 5/1972 | Cross et al. | 357/76 X |
| 3,719,862 | 6/1973 | Gaicki | 357/75 |
| 3,723,836 | 3/1973 | Shekerjian et al. | 357/75 |
| 3,832,606 | 8/1974 | Furnival | 357/75 |

FOREIGN PATENT DOCUMENTS

| | | | |
|---|---|---|---|
| 1071233 | 11/1956 | Fed. Rep. of Germany | 357/76 |

*Primary Examiner*—William D. Larkins
*Assistant Examiner*—S. V. Clark
*Attorney, Agent, or Firm*—Polster, Polster and Lucchesi

[57] ABSTRACT

A diode rectifier assembly includes a plurality of diodes having an anode and cathode sides. A plate electrically connects one side of the diodes while a current-regulating plate connects the other side of the diodes. The current-regulating plate includes a plurality of diode contact areas, a common conduction area and a plurality of links, each link electrically interconnecting one of the diode contact areas and the common conduction area. Each diode contact area connects a link to a diode, the links have predetermined areas for regulating current flow through associated diodes. The links have positive coefficient of resistence, and each diode contact area is thermally conductive, providing thermal connection from its associated diode to its associated link. The diode contact areas are held against the diodes by a resilient ring of insulating material. The links provide fuses for disconnecting diodes from the common conduction area when excessive current flows in a diode.

4 Claims, 6 Drawing Figures

RECTIFIER ASSEMBLY FOR PARALLEL CONNECTION OF DIODES

This is a continuation application of copending application Ser. No. 519,896, filed on Aug. 4, 1983, which is a continuation application of Ser. No. 222,326, filed Jan. 5, 1981, both now abandoned.

BACKGROUND OF THE INVENTION

This invention relates to diode rectifiers in general, and particularly to a diode rectifier assembly in which a plurality of diodes are connected in parallel.

In order to provide high current handling capacity from semi-conductor diodes, it is common to connect a number of individual diodes in parallel. Such diodes are often mounted in parallel within a hermetically sealed metal container having two leads. One lead represents the anode connection of the diodes, and the other lead represents the cathode connection of the diodes. When the diodes are so connected, they must be very carefully matched in characteristics in order to avoid imbalances in the amount of current conducted by the individual diodes. Such imbalances of current flow can result in heating of a diode which carries greater part of the current, which in turn can result in thermal runaway. Thermal runaway is a condition in which as the diode temperature increases its conductance increases thereby causing the diode to pass an even greater part of the current of the rectifier. Once a thermal runaway condition has been reached, increasing temperature and current flow in the individual diode will eventually destroy that diode. Quite often the destruction of such an individual diode results in a short circuit in that particular diode thereby rendering the entire rectifier inoperative.

Matching of diodes in such rectifiers generally consists of growing the individual diodes from the same crystal and carefully checking to assure that they have similar characteristics. Such a process makes the cost of the complete rectifier substantially more than the sum of the cost of ordinary individual diodes.

In certain rectifier applications such as battery chargers, diode rectifiers must not only be able to withstand normal battery charging currents, but are also called upon to supply currents as much as ten (10) times normal, such as when a motor vehicle to which a battery charger is connected is attempted to be started. An encapsulated diode rectifier of the type previously discussed is easily damaged by excessive current through the rectifier. While the individual diodes making up the rectifier could sustain such excess currents if adequate cooling capability was present, the structure of such an encapsulated rectifier does not permit the rapid dissipation of such excessive heat when such current is applied. In such a rectifier device the heat generated within the rectifier under those conditions tends to destroy the individual diodes. If encapsulated rectifiers are to be used in a battery charger type circuit where such excess currents above normal currents are to be expected, it is necessary to utilize rectifiers having a rated current capacity far in excess of the normal current condition of the circuit. Costs of encapsulated rectifiers increases substantially with increase in current carrying capacity.

SUMMARY OF THE INVENTION

This diode rectifier assembly provides a device which is capable of utilizing individual diodes which are not closely matched. The assembly will continue to function even if individual diodes fail and short out, and the assembly is capable of sustaining severe current overloads without destroying the rectifier.

The diode rectifier assembly includes a plurality of diodes, each of the diodes having anode and cathode sides. A first means electrically connects one of the sides of each diode, and a second means electrically connects the other of the sides of the diodes. The second means includes means for selectively regulating the electrical current flow through each diode in response to current flow through said diode.

The second means includes a plurality of diode contact areas, a common conduction area and a plurality of links. Each link electrically interconnects one of the diode contact areas and the common conduction area, while each diode contact area connects a link to a diode. The links have predetermined areas for regulating the current flow through the associated diodes.

In one aspect of the invention, each diode contact area is thermally conductive for providing thermal conduction from its associated diode to its associated link. In another aspect of the invention, the links have a positive coefficient of resistance. In yet another aspect of the invention, the links have a cross-section and resistance providing greater electrical resistance than the contact areas.

In yet another aspect of the invention, the common conduction area defines a central area, and the links extend radially from the common conduction area. The diode contact areas are peripherally spaced about the common conduction area with each link interconnecting one of the diode contact areas and the common conduction area. The common conduction area, the links and the diode contact areas are formed of an integral piece stamped from sheet metal.

In yet another aspect of the invention, means apply pressure to the diode contact areas for holding the diode contact areas against the diodes. In one aspect, the means applying pressure to the diode contact areas includes a resilient ring of insulating material engaging the diode contact areas for holding the diode contact areas against the other sides of the diodes and for holding the one side of the diodes against the first means. In another species of the invention, the means applying pressure to the diode contact areas includes a pressure washer and insulator, the pressure washer applying pressure to the diode contact areas through the insulator for holding the diode contact areas against the other sides of the diodes and for holding the one side of the diodes against the first means.

In one aspect of the invention, each link regulates current flow through its associated diode by melting away, thereby providing a fuse for electrically disconnecting said diode from the common conduction area upon excessive current flow in said diode.

DESCRIPTION OF THE PREFERRED EMBODIMENTS

Figures 1, 2, 3:
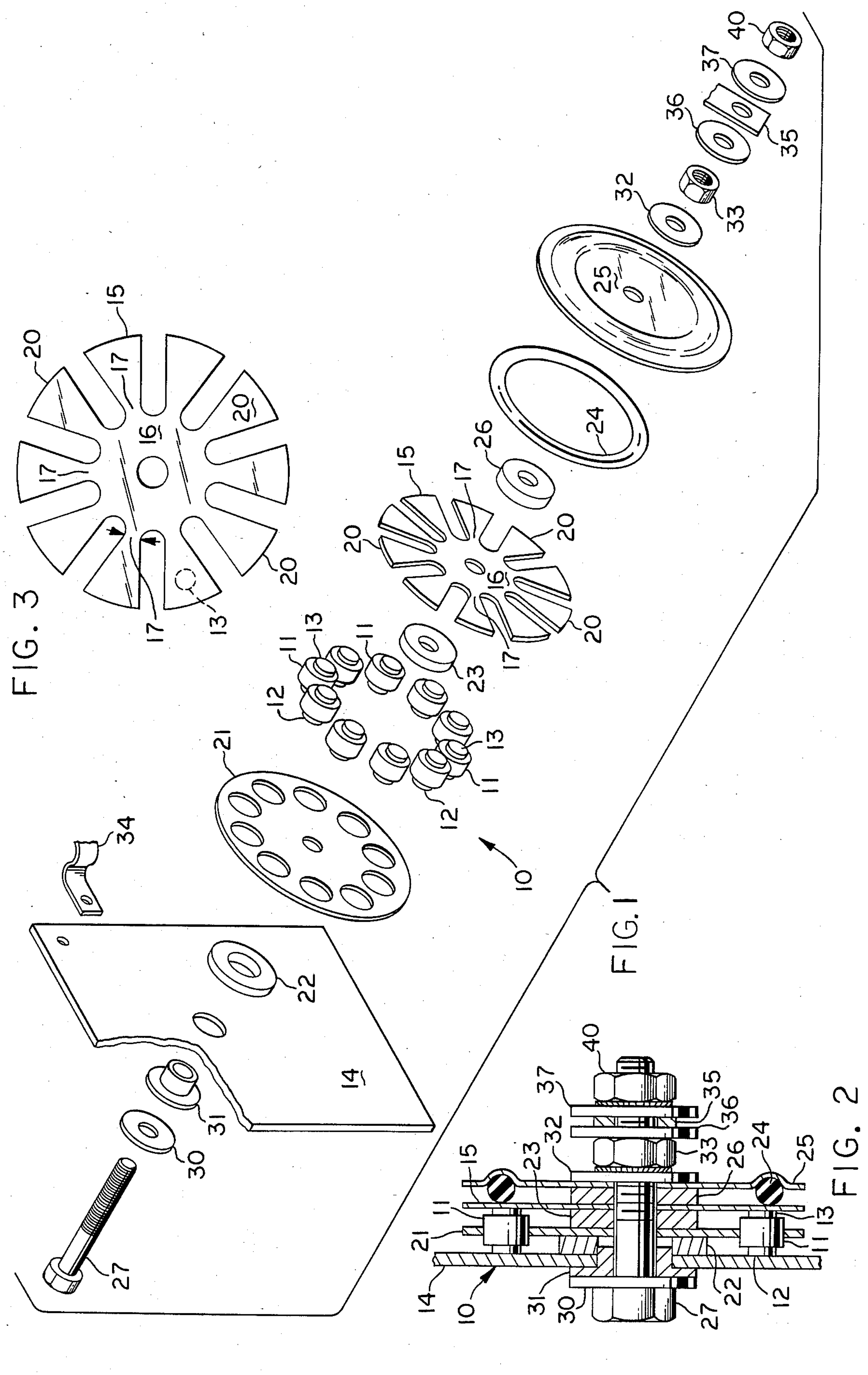
FIG. 1 is an exploded view of a diode rectifier assembly.
FIG. 2 is a cross-sectional view of the diode rectifier assembly shown in FIG. 1.
FIG. 3 is a plan view of the current-regulating plate of the diode rectifier assembly shown in FIG. 1.

Referring now by characters of reference to the drawings, and first to the embodiment of FIGS. 1–3, it will be understood that the diode rectifier assembly generally indicated by 10 includes a plurality of diodes 11 having anode sides 12 and cathode sides 13. A plate 14 constitutes first means electrically connecting one of the sides of the diodes 11. In this assembly, the anode sides 12 contact the plate 14.

A current-regulating plate 15 includes a central common conduction area 16, a plurality of links 17 extending radially from the common conduction area, and a plurality of diode contact areas 20. A diode contact area 20 is attached to each link 17. Each diode contact area 20 engages the cathode side 13 of one of the diodes 11. The links 17 electrically interconnect the diode contact areas 20 and the common conduction area 16.

An insulated diode-spacer 21 has a plurality of holes for receiving the diode 11, and for holding and positioning the diodes 11 for proper alignment with the contact areas 20 of the current-regulating plate 15. The diode-spacer 21 is spaced from the plate 14 by a washer 22, and spaced from current-regulating plate 15 by a washer 23.

An O-ring 24 and grooved washer 25 constitute means applying pressure to the diode contact areas 16 for holding said contact areas 16 against the diodes 11. The O-ring 24 electrically insulates the grooved washer 25 from the diode contact areas 20. A washer 26 spaces the grooved washer 25 from the current-regulating plate 15.

A bolt 27 is provided for fastening together the various parts of the diode rectifier assembly 10. The bolt 27 passes through a washer 30, and then passes through an insulator bushing 31, the plate 14 and the washer 22. The insulator bushing 31 serves to electrically insulate the bolt 27 and washer 30 from the plate 14 and from the washer 22.

The bolt 27 then passes through the diode spacer 21, washer 23, current-regulating plate 15, washer 26, O-ring 24 and grooved washer 25. The bolt 27 is fastened with a washer 32 and nut 33.

A strap 34 is attached to the plate 14 for providing electrically connection to the one side of the diodes 11. A strap 35 is attached to the end of the bolt 27 by washers 36 and 37 and nut 40. The strap 35 provides electrical connections to the common conduction area 16 of the current-regulating plate 15 through the bolt 27 and through the grooved washer 25, and washer 26.

Figures 4, 5, 6:
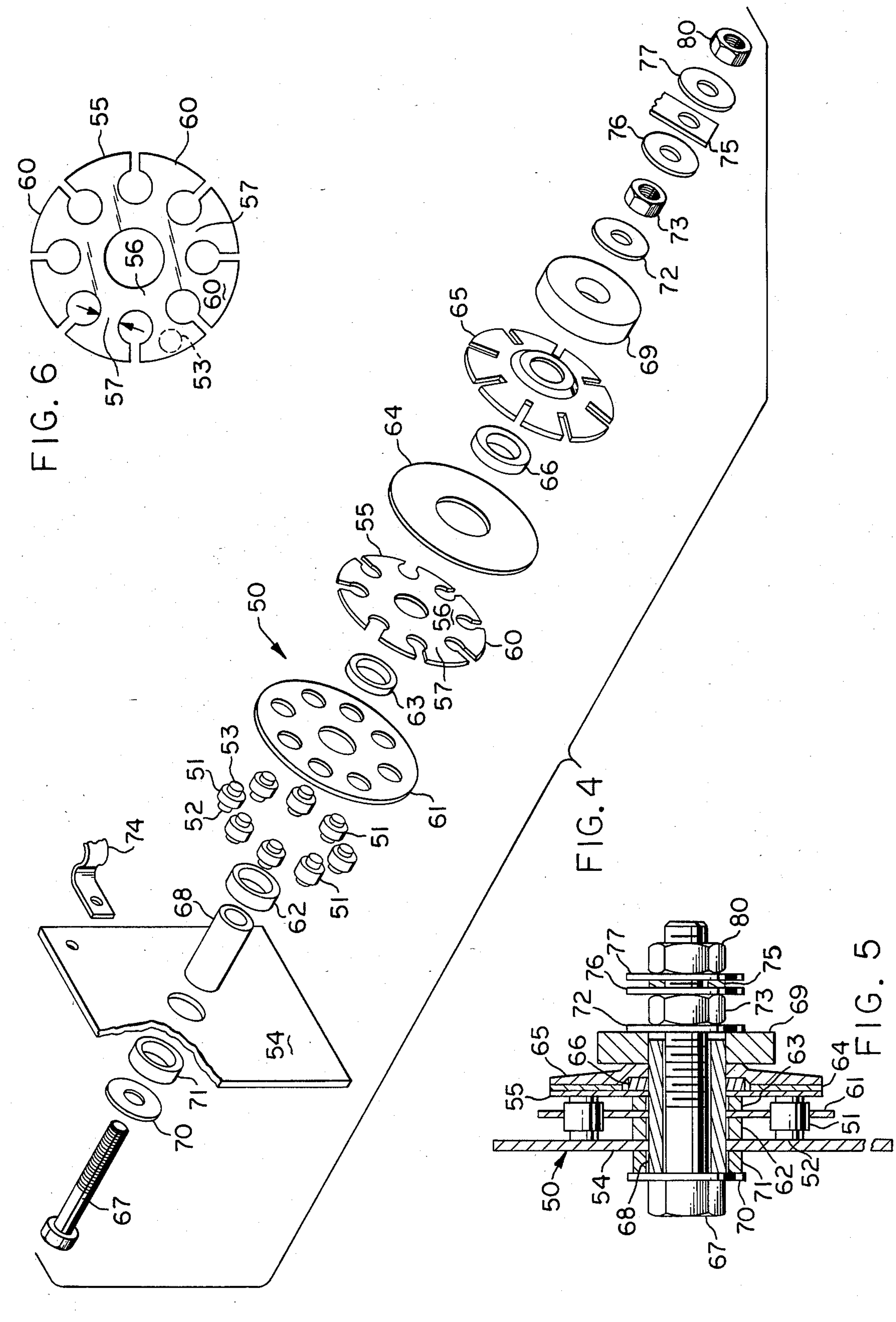
FIG. 4 is an exploded view of a modified diode rectifier assembly.
FIG. 5 is a cross-sectional view of the modified diode rectifier assembly shown in FIG. 4.
FIG. 6 is a plan view of the current-regulating plate of the modified diode rectifier assembly shown in FIG. 4.

Referring now to a modified diode rectifier assembly 50 shown in FIGS. 4–6, parts of the modified diode rectifier assembly 50 which correspond to parts of the diode rectifier assembly 10 of FIGS. 1–3 are given corresponding reference characters. The diode rectifier assembly 50 utilizes an insulated disc 64 which is maintained against a current-regulating plate 55 by a pressure washer 65 for holding diode contact areas 60 against the ends 53 of the diodes 51. A bolt 67 passes through a washer 70, and passes through an insulator 71 which insulates the washer 70 from the plate 54. An insulator sleeve 68 insulates the bolt 67 from the plate 54 and washer 62. The bolt 67 passes through the diode-spacer 61, washer 63, current-regulating plate 55, insulated disc 64, washer 66, pressure washer 65, washer 69, washer 72 and is fastened by nut 73, washers 76 and 77 and nut 80 hold strap 75 on the end of the bolt 67. A strap 74 is attached to the plate 54.

It is thought that the structural features and functional advantages of the embodiments of the diode rectifier assembly have become fully apparent from the foregoing description of parts but for completeness of disclosure, a brief description of the operation of each embodiment of the assembly will be given.

Referring first to the diode rectifier assembly 10 of FIGS. 1–3, it will be seen that the assembly is utilized for connecting a plurality of diodes 11 in parallel in order to obtain higher current capacity than can be obtained with a single diode 11. The current-regulating plate 15 serves to regulate current in individual diodes 11 by acting both to balance currents in individual diodes 11, and to function as a fuse for disconnecting particular individual diodes 11 from the remaining diodes 11 in the event of excessive current flow through a particular individual diode 11.

The current-regulating plate 15, including links 17, is made of a electrically conductive metal having a positive coefficient of resistance. The links 17 present an area of reduced cross-section as compared to the diode contact areas 20. Current flowing in an individual diode 11 passes through its associated contact area 20 and through its associated link 17 between each diode 11 and the common conduction area 15. Because of the reduced cross-sectional area of the links 17, the resistance of the links 17 is relatively higher than the electrical resistance of the diode contact areas 20, therefore representing an increased $I^2R$ (current squared times resistance) loss in the links. This resistive power loss in the links 17 results in an increased temperature in the links 17, which in turn increases its resistance, and thereby acts to limit current flow through the links 17. A diode 11 that is conducting greater current than other diodes 11 will therefore experience a greater voltage drop across its link 17.

Should an individual diode 11 become hot, heat will be transferred from the diode 11 to the link 17 by the diode contact area 20. The transferred heat will, in turn, increase the resistance of the link 17. When the currents in the diodes 11 are approximately equal, the voltage drops across the links 17 will be approximately equal. However, when an individual diode 11 is conducting greater current than other diodes 11 there will be a greater loss in its link 17 and a greater resistance in series with that diode 11.

In the event that excessive current flows in a particular diode 11, its link 17 will act as a fuse and melt away, thereby disconnecting the diode 11 and its associated diode contact area 20 from the common conduction area 16. Since the diode 11 which conducted the excessive current is then electrically isolated from the other diodes 11 the diode rectifier assembly 10 can operate with the remaining diodes 11. If a diode 11 fails by shorting out, its link 17 will melt, thereby isolating the diode and allowing the rectifier assembly to be utilized with the remaining diodes 11.

In order to assure good electrical contact between the plate 14 and the diodes 11, and between the diode contact areas 20 and the diodes 11, the diode contact areas 20 must be held firmly against the diodes 11. This is accomplished by holding the resilient O-ring 24 tightly against the diode contact areas 20 by tightly fastening down the groove washer 25 over the O-ring 24. The O-ring 24 serves to hold a diode contact area 20 against its diode 11 even after its associated link 17 has been melted away.

The open structural arrangement of the diode-rectifier assembly 10 allows the assembly to conduct excessive current for short periods of time, for example when used for starting an automobile to which a battery charger utilizing the diode-rectifier assembly 10 is connected, without destroying the diode-rectifier assembly 10. Excessive heat generated within the diodes 11 is not closely contained and can be radiated and conducted away by the plate 14 and the current-regulating plate 15 for short periods of current overload conditions.

While the diodes 11 can be positioned with either their anode sides 12 or cathode sides 13 against the plate 14, the anode sides 12 are shown contacting the plate 14. This positioning can be used in applications such as battery charger in which a transformer having a center-tapped secondary is full-wave rectified. A second diode rectifier assembly 10 can be mounted directly to the plate 14. In such an arrangement, the plate 14 and strap 34 serve as the positive output terminal while the A.C. is applied to the straps 35.

The operation of the diode rectifier assembly 50 of FIGS. 4–6 is similar. However, the current-regulating plate 55 is held against the diodes 51 by force applied by the pressure washer 65 through the insulator disc 64. The insulator disc 64 serves to hold the diode contact areas 60 against the diodes 51 when the links 57 are melted.

It will be understood, that the diodes 11 of the species shown in FIGS. 1–3 can be soldered to either or both of the plate 14 and the current-regulating plate 15. Likewise, the diodes 51 of the species shown in FIGS. 4–6 can be soldered to either or both of the plate 54 and the current-regulating plate 55.

I claim as my invention:

1. A diode rectifier assembly comprising:

a plurality of diodes, each diode having anode and cathode sides, a first means electrically connecting one of the anode and cathode sides of each of said diodes to one another, a second means electrically connecting the other of said anode and cathode sides of each of said diodes to one another, said second means including:

a common conduction area defining a central electronically conductive area, a plurality of links extending radially from the common conduction area, each link having a predetermined area for regulating current flow through said predetermined area, said predetermined area delimiting a fuse which opens under predetermined conditions so as to disconnect an individual one of said plurality of diodes from said central conduction area, thereby permitting said rectifier assembly to operate even with failure of individual ones of said diode plurality, and a plurality of diode contact areas peripherally spaced about the common conduction area, each diode contact area engaging one of said anode and cathode sides of said diodes, each link interconnecting one of the diode contact areas and the common conduction area, said second electrically connecting means being integrally formed from a single material sheet, and pressure means engaging and applying pressure to the diode contact areas of said second electrically connecting means for holding the diode contact areas against one of said anode and cathode sides of said diodes and holding the other of said anode and cathode sides of said diodes against said first electrically connecting means, said pressure means maintaining mechanical and electrical contact between the anode and cathode sides of said diodes and respective ones of said first and said second electrically connecting means, and wherein each diode area is thermally conductive for providing thermal conduction from its associated diode to its associated link, the links have a positive coefficient of resistance, and the links have a cross-section providing greater electrical resistance than the contact areas.

2. A diode rectifier assembly as defined in claim 1, in which:

the pressure means includes a resilient ring of insulating material engaging the diode contact areas for holding the diode contact areas against the other sides of the diodes and for holding the one side of the diodes against the first means.

3. A diode rectifier assembly as defined in claim 1, in which:

the pressure means includes a pressure washer and an insulator, the pressure washer applying pressure to the diode contact areas through the insulator for holding the diode contact areas against the other sides of the diodes and for holding the one side of the diodes against the first means.

4. A diode rectifier assembly as defined in claim 1, in which:

each link regulates current flow through its associated diode by melting away, thereby providing a fuse for electrically disconnecting said diode from the common conduction area when excessive current flows in said diode.

* * * * *

UNITED STATES PATENT AND TRADEMARK OFFICE
CERTIFICATE OF CORRECTION

PATENT NO. : 4,554,574

DATED : November 19, 1985

INVENTOR(S) : Bruce R. Wright

It is certified that error appears in the above-identified patent and that said Letters Patent is hereby corrected as shown below:

Column 6, line 24, "diode area", should be "diode contact area".

Signed and Sealed this

*Twenty-ninth* Day of *April 1986*

[SEAL]

*Attest:*

DONALD J. QUIGG

*Attesting Officer* *Commissioner of Patents and Trademarks*